(12) United States Patent
Fath et al.

(10) Patent No.: US 10,890,637 B2
(45) Date of Patent: Jan. 12, 2021

(54) MAGNETIC RESONANCE GRADIENT COIL FOR GENERATING A MAGNETIC FIELD GRADIENT AND A MAGNETIC FIELD OF A HIGHER ORDER

(71) Applicant: Siemens Healthcare GmbH, Erlangen (DE)

(72) Inventors: Sascha Fath, Erlangen (DE); Andreas Krug, Fuerth (DE)

(73) Assignee: Siemens Healthcare GmbH, Erlangen (DE)

( * ) Notice: Subject to any disclaimer, the term of this patent is extended or adjusted under 35 U.S.C. 154(b) by 87 days.

(21) Appl. No.: 16/047,274

(22) Filed: Jul. 27, 2018

(65) Prior Publication Data

US 2019/0033405 A1     Jan. 31, 2019

(30) Foreign Application Priority Data

Jul. 28, 2017  (DE) .................. 10 2017 213 026

(51) Int. Cl.
*G01R 33/385* (2006.01)
*G01R 33/3875* (2006.01)

(52) U.S. Cl.
CPC ....... *G01R 33/3852* (2013.01); *G01R 33/385* (2013.01); *G01R 33/3875* (2013.01)

(58) Field of Classification Search
CPC .............. G01R 33/3852; G01R 33/385; G01R 33/3875
USPC ....................................................... 324/309
See application file for complete search history.

(56) References Cited

U.S. PATENT DOCUMENTS

| | | | | |
|---|---|---|---|---|
| 4,310,799 A | * | 1/1982 | Hutchison | G01R 33/385 324/319 |
| 4,456,881 A | * | 6/1984 | Compton | H01F 7/20 324/309 |
| 4,585,995 A | * | 4/1986 | Flugan | G01R 33/385 324/322 |
| 4,890,061 A | * | 12/1989 | Den Boef | G01R 33/385 324/320 |
| 4,893,083 A | * | 1/1990 | Overweg | G01R 33/34046 324/318 |
| 5,012,191 A | * | 4/1991 | Siebold | G01R 33/385 324/318 |
| 5,079,503 A | * | 1/1992 | Siebold | G01R 33/3852 324/309 |
| 5,256,970 A | * | 10/1993 | Ham | G01R 33/3875 324/318 |
| 5,270,657 A | * | 12/1993 | Wirth | G01R 33/3852 324/318 |
| 5,280,248 A | * | 1/1994 | Zou | G01R 33/34061 324/318 |
| 5,378,989 A | * | 1/1995 | Barber | G01R 33/385 324/318 |
| 5,552,708 A | * | 9/1996 | Ham | G10K 11/178 324/318 |
| 5,998,998 A | * | 12/1999 | Westphal | G01R 33/385 324/300 |

(Continued)

*Primary Examiner* — Christopher P McAndrew
(74) *Attorney, Agent, or Firm* — Schiff Hardin LLP (57) ABSTRACT

A gradient coil for magnetic resonance imaging has at least two conductors that are independent of one another, designed to jointly generate a magnetic field gradient and a magnetic field of a higher order in the examination region of a magnetic resonance scanner.

13 Claims, 6 Drawing Sheets

(56) References Cited

U.S. PATENT DOCUMENTS

| | | | |
|---|---|---|---|
| 6,107,800 A * | 8/2000 | Claasen-Vujcic | G01R 33/56581 324/319 |
| 6,900,638 B1 * | 5/2005 | Yair | G01R 33/3852 324/309 |
| 10,007,885 B1 * | 6/2018 | Gorshkov | G01N 29/4472 |
| 2001/0024122 A1 * | 9/2001 | Mulder | G01R 33/385 324/318 |
| 2001/0048305 A1 * | 12/2001 | Borsi | G01R 33/385 324/322 |
| 2003/0094949 A1 * | 5/2003 | Kimmlingen | G01R 33/385 324/318 |
| 2003/0160613 A1 * | 8/2003 | Bechtold | G01R 33/385 324/315 |
| 2009/0209842 A1 * | 8/2009 | Koevoets | G01R 33/3854 600/410 |
| 2010/0171495 A1 * | 7/2010 | Bovier | G01R 33/3873 324/309 |
| 2011/0144478 A1 * | 6/2011 | Zabow | A61K 49/18 600/420 |
| 2011/0175616 A1 * | 7/2011 | Ochi | G01R 33/34076 324/318 |
| 2012/0025832 A1 * | 2/2012 | Schmidig | G01R 33/3415 324/322 |
| 2012/0323113 A1 * | 12/2012 | Biber | A61B 5/6814 600/422 |
| 2014/0333306 A1 | 11/2014 | Ham | |
| 2015/0377997 A1 * | 12/2015 | Zabow | G01R 33/5601 324/309 |
| 2016/0077173 A1 * | 3/2016 | Juloski | G05B 17/02 324/307 |
| 2016/0231400 A1 * | 8/2016 | Fath | G01R 33/3875 |
| 2016/0259020 A1 * | 9/2016 | Okamoto | G01R 33/34076 |
| 2017/0131372 A1 | 5/2017 | Dewdney et al. | |
| 2017/0139022 A1 * | 5/2017 | Lee | G01R 33/3802 |
| 2017/0160357 A1 | 6/2017 | Biber et al. | |

\* cited by examiner

MAGNETIC RESONANCE GRADIENT COIL FOR GENERATING A MAGNETIC FIELD GRADIENT AND A MAGNETIC FIELD OF A HIGHER ORDER

BACKGROUND OF THE INVENTION

Field of the Invention

The present invention relates to a gradient coil having two conductors, which are independent of one another, for generating a magnetic field gradient and a magnetic field of a higher order for use in a magnetic resonance scanner. Furthermore, the present invention relates to a gradient coil unit and to a method for generating a magnetic field gradient and a magnetic field of a higher order with such a gradient coil unit.

Description of the Prior Art

In a magnetic resonance scanner, the body to be examined of an examination object, in particular a patient, is exposed, with the use of a basic field magnet, to a relatively high basic magnetic field of 1.5 or 3 or 7 Tesla for instance. In addition, gradient pulses are activated with the use of a gradient system. Radio-frequency pulses, for instance excitation pulses, are then transmitted via a radio-frequency antenna unit using suitable antenna coils, with the result that the nuclear spins of particular atoms resonantly excited by these radio-frequency pulses are deflected by a defined flip angle compared to the magnetic field lines of the basic magnetic field. As the nuclear spins relax, radio-frequency signals known as magnetic resonance signals are emitted, and are received and then further processed using suitable radio-frequency antennas. From the raw data acquired in this way, the desired image data can ultimately be reconstructed.

Magnetic field gradients generated by gradient coil units are used for spatially encoding the magnetic resonance signals in the magnetic resonance tomography system. A gradient coil unit typically has a gradient coil and at least one voltage source, in particular a gradient amplifier, which is designed to activate the gradient coil. A gradient coil of this type has at least one conductor, with which a magnetic field gradient is generated in precisely one direction by applying a current to the at least one conductor. For this purpose, the at least one conductor of the gradient coil preferably has a rigid structure, which can be achieved by casting the conductor in a casting compound, for instance. Magnetic field gradients in three directions, which are independent of one another are typically required for magnetic resonance imaging, these three directions covering a three-dimensional space. For this purpose three gradient coils, in particular three gradient coil units, are typically required, which are included in a gradient system. In addition, shim coils are typically included in the gradient system. The three gradient coils are typically cast to form a unitary component. The three gradient coils are typically positioned around an opening of the magnetic resonance scanner.

The homogeneity of at least one magnetic field generated by the magnetic resonance device is of great importance for the magnetic resonance imaging, since a local deviation in the at least one magnetic field can result in an erroneous spatial encoding during the acquisition of the raw data. This may result in visible artifacts in the image data. A magnetic field of this type generated by a magnetic resonance scanner can be a static magnetic field, for instance, in particular the basic magnetic field and/or at least one magnetic field gradient. The magnetic field gradients are switched on and off as gradient pulses within milliseconds, which causes eddy currents to form on the conductive structures surrounding the gradient coils due to the induction. The eddy currents in turn generate magnetic vortex fields which may reduce the homogeneity of the magnetic field gradient. DE 10 2015 224 043 A1 describes a method for reducing a vortex field in a magnetic resonance tomography system.

Furthermore, shim coils for improving the homogeneity of the magnetic fields of the magnetic resonance scanner are known, in particular for static magnetic fields such as the basic magnetic field. The process of improving the homogeneity of magnetic fields is referred to as shimming. Shim coils of this type typically have a conductor with which a magnetic compensation field can be generated by applying a defined electric current. This compensation field compensates for deviations in the homogeneity of a magnetic field within the examination region. Shim coils are typically designed to generate magnetic fields of the second order (i.e., with a quadratic term and/or a higher order. Shim coils can also be designed to generate magnetic fields of the first order. Shim coils of this type are typically not shielded, since this would require additional space, as a result of which the examination region would be restricted. Due to the lack of shielding, particularly strong electromagnetic interactions occur with the conductive structures surrounding the shim coil, as a result of which, particularly with a rapid switching of the shim coil, eddy currents and magnetic vortex fields associated therewith may develop, which may compromise the effect of the shim unit in the examination region.

With static magnetic fields and static compensation fields associated therewith, electromagnetic interactions of this type and/or magnetic vortex fields may be disregarded and/or monitored.

Dynamic magnetic fields of a higher order, as are required with gradient array-type imaging, with dynamic shimming or with the compensation of magnetic vortex fields of a higher order, typically cannot be generated by known shim coils. Typical specifications of the shim coil, such as the thickness of the conductor and maximum spatial extent of the shim coil, limit the strength of the compensation field that can be generated by conventional shim coils, which typically is at most 5% of the strength of the maximum magnetic field gradient.

DE 10 2015 222 114 A1 describes a method for dynamic shimming with dynamic compensation fields of a higher order, which can be executed by conventional shim coils. However, this method requires a flexible, regulatable voltage source, in particular a flexible, regulatable amplifier for the shim coil. Furthermore, a rapid switching of the unshielded shim coil results in magnetic vortex fields in the examination region. Alternatively, special shim coils with particularly strong amplifiers can be used for rapid switching of high-strength compensation fields, such shim coils being arranged for a special examination within the patient receiving region of the magnetic resonance scanner. The patient receiving region is typically reduced in size in this way, which is particularly disadvantageous.

SUMMARY OF THE INVENTION

An object of the present invention is to provide a compact gradient coil, which is designed to effectively compensate for dynamic modifications in the homogeneity of the magnetic field gradient generated thereby.

The inventive gradient coil has at least two conductors that are independent of one another in terms of structure and the respective currents flowing therein, and the at least two independent conductors are designed to operate in combination with each other so as to jointly generate a magnetic field gradient in an examination region of a magnetic resonance scanner to also jointly generate a magnetic field of a higher order in that examination region.

A magnetic field of the zeroth order is a magnetic field with a homogeneous strength and homogeneous direction in a predetermined region, for instance the examination region. A magnetic field gradient is typically a dynamic magnetic field, even if only temporarily. A magnetic field gradient is typically a magnetic field of the first order, wherein the strength of the magnetic field changes linearly in precisely one direction, in particular along and parallel to an axis in a predetermined region, for instance the examination region of the scanner. In a plane at right angles to the axis, the magnetic field gradient preferably has a homogeneous strength. Magnetic fields of a higher order are typically characterized by non-linear spatial modifications to the strength. For defining the magnetic field of the zeroth order, the magnetic field gradient, and the magnetic fields of a higher order, reference is typically made to a spatial component of the cited fields, typically the z-component.

The at least two conductors that are independent of one another are electrical conductors designed to conduct electric currents up to 1400 A, preferably up to 2000 A, these currents being switched on and off within milliseconds. In addition, the spatial arrangement of the at least two conductors that are independent of one another is determined by the magnetic field gradients to be generated jointly and the magnetic field of a higher order to be generated jointly. This spatial arrangement of the at least two conductors that are independent of one another is fixed by casting. The at least two conductors that are independent of one another are typically molded (cast) such that a major part thereof is arranged on a lateral area of a cylinder. The examination region or volume of the scanner, in which at least a part of the examination object can be positioned is typically arranged within a cylindrical opening that proceeds through the scanner. In particular, the part of the examination object from which image data are to be produced, is disposed within the examination region. The at least two conductors that are independent of one another have electromagnetic properties so that, by their activation together, they generate a magnetic field gradient as well as a magnetic field of a higher order.

The two conductors are considered to be independent of one another if a first current in a first conductor of the two conductors, and a second current in a second conductor of the two conductors, are selected and/or generated independently of each other. The first conductor is physically separate from the second conductor. The two conductors that are independent of one another are situated with respect to each other so as to produce an electromagnetic interaction therebetween. The first conductor of the two independent conductors is preferably designed to generate a first component of the magnetic field gradient and a first component of the magnetic field of a higher order. The second conductor of the two independent conductors is preferably designed to generate a second component of the magnetic field gradient and a second component of the magnetic field of a higher order. The first component of the magnetic field gradient, the first component of the magnetic field of a higher order, the second component of the magnetic field gradient and/or the second component of the magnetic field of a higher order are combined by the interaction between the first conductor and the second conductor. Superimposing the first component of the magnetic field gradient and the second component of the magnetic field gradient in the examination region results in the overall (total) magnetic field gradient. Superimposing the first component of the magnetic field of a higher order and the second component of the magnetic field of a higher order in the examination region preferably results in the overall (total) magnetic field of a higher order. When the magnetic field of a higher order and the magnetic field gradient are generated at the same time, this results in the two magnetic fields being superimposed in the examination region. The same applies if more than two independent conductors are used. Conductors that are independent of one another are activated separately (individually).

The first conductor of the at least two independent conductors can be arranged on a first cylindrical surface, for instance, such that the first conductor covers the first cylindrical surface in the radial direction by at least 80%, preferably at least 90%, over at least one longitudinal position. The second conductor of the at least two independent conductors can be arranged on a second cylindrical surface, such that the second conductor covers the second cylinder surface in the radial direction by at least 80%, preferably at least 90%, over at least one longitudinal position. The first cylindrical surface and the second cylindrical surface have a uniform size and/or are molded the same. Within the gradient coil, the first conductor and second conductor are preferably adjacent to one another along the longitudinal axis of the gradient coil. The magnetic field of a higher order thus can be produced when electric currents re generated in opposite directions at adjacent positions of the first conductor and the second conductor. The magnetic field of the first is produced when rectified electric current are generated at adjacent positions of the first conductor and the second conductor. Adjacent positions of the first conductor and the second conductor are positions wherein there is a minimal gap between the first conductor and the second conductor parallel to the longitudinal axis of the gradient coil. No physical existence of the first cylindrical surface and/or the second cylindrical surface is required.

The gradient coil can be designed to generate the magnetic field gradient at right angles to the longitudinal direction by the first conductor being formed by two symmetrical conductor loops, which are arranged opposite one another on the first cylindrical surface. When the first current is generated in the first conductor, this is rectified at adjacent positions of the two symmetrical conductor loops of the first conductor. The second conductor preferably is formed by two symmetrical conductor loops, which are arranged opposite one another on the second cylindrical surface. When the second current is generated in the second conductor, this is rectified at adjacent positions of the two symmetrical conductor loops of the second conductor. Adjacent positions of the conductor loops of a conductor are positions where there is a minimal gap from the conductor loops in the radial direction. For the gradient coil to generate the magnetic field gradient in the longitudinal direction, the first conductor is arranged in the manner of a spiral on the first cylindrical surface and the second conductor is arranged in the manner of a spiral on the second cylindrical surface.

An advantage of the inventive gradient coil is that it is able to generate both a magnetic field gradient and a magnetic field of a higher order, in other words a shim field. In this way it is possible to dispense with a dedicated shim coil designed to generate the magnetic field of a higher order in order to increase a homogeneity of a magnetic field, preferably the homogeneity of the basic magnetic field and/or the magnetic field gradient. The magnetic field of a higher order can also be designed to increase the homogeneity of the magnetic field gradient of a further gradient coil. In particular, magnetic vortex fields can be reduced and/or compensated without an additional shim coil. The inventive gradient coil achieves a simple and precise compensation of magnetic vortex fields of a second order. The inventive gradient coil can accordingly be designed to generate a magnetic field gradient and magnetic fields for vortex field compensation and/or magnetic fields of a higher order. Such magnetic fields for vortex field compensation and/or magnetic fields of a higher order can be used, for instance, in a quasistatic manner for shimming in the examination region and/or for dynamic shimming. In particular, the inventive gradient coil can be used for spatial encoding when gradient array techniques are used.

Dispensing with a shim coil reduces the cost of the gradient system. The cost for purchasing and assembling the shim coil are omitted and/or reduced, and the complicated positioning of the shim coil relative to the gradient coil is unnecessary. In addition, the spatial requirement for the gradient system can be reduced by dispensing with a shim coil. In particular, the radial extent of the part of the gradient system, which partially surrounds the examination region, is reduced. As a result, the patient receiving region, in particular the examination region, can be enlarged, which improves the comfort for the examination object. As a result, the gradient coil can be designed in a particularly compact manner.

In an embodiment of the inventive gradient coil, the magnetic field of a higher order and/or the magnetic field gradient is/are generated dynamically. Magnetic field gradients are typically generated within the scope of a gradient pulse according to an MR control sequence and serve for spatial encoding. The amplitude and/or slew rate and/or duration of a magnetic field gradient, and/or the temporal sequence of a number of magnetic field gradients, and/or the point in time at which the magnetic field gradient is to be generated, are typically predetermined in the MR control sequence. A magnetic field gradient is accordingly typically only activated temporally, for a few milliseconds for instance. The magnetic vortex fields generated by the magnetic field gradient are accordingly typically also temporary, and thus time-dependent. For instance, magnetic vortex fields are influenced by time constants of the structures of the magnetic resonance scanner in which the original eddy currents occur. Similarly, the aforementioned properties predetermined by the MR control sequence influence such magnetic vortex fields.

This embodiment of the gradient coil achieves a time-dependent compensation of magnetic vortex fields on account of the dynamically generatable magnetic field of a higher order. As a result, dynamic deviations in the homogeneity of a magnetic field gradient, such as occur for instance on account of magnetic vortex fields, can be dynamically compensated. A particularly high homogeneity of one or more magnetic field gradients thus can be ensured in a time-independent manner. This causes the quality of the resulting image data to be particularly high. The compensation of magnetic vortex fields of a second order requires dynamic shimming, which is achievable with this embodiment of the gradient coil.

In another embodiment of the inventive gradient coil, the magnetic field gradient and the magnetic field of a higher order are generated jointly by a first current in a first of the at least two independent conductors and a second current in a second of the at least two independent conductors which are independent of one another. The first current and the second current are selected independently of one another. The first conductor and the second conductor are activated independently of one another with these different currents.

A gradient controller (processor) is designed to determine the first current and the second current. This controller assumes a magnetic field gradient to be generated and a magnetic field of a higher order to be generated. For this purpose, the gradient controller will provide an item of information designating the dependency of a magnetic field generated by the first conductor on the current in the first conductor and optionally on the current in the second conductor. In addition or alternatively, the gradient controller provides an item of information designating the dependency of a magnetic field generated by the second conductor on the current in the second conductor, and optionally on the current in the first conductor.

The gradient controller can be designed to determine a basic current that is to be supplied to both the first conductor and the second conductor, wherein the magnetic field gradient to be generated is generated while simultaneously activating the first conductor and the second conductor according to the respective basic current therein. The gradient controller is designed to also determine a further current for the first conductor and the second conductor, wherein the magnetic field of a higher order to be generated is generated while simultaneously activating the first conductor and the second conductor according to the respective further current therein. The first current and the second current are then the sum of the basic current and of the further current of the respective conductor. Superimposing the magnetic field generated by the first current in the first conductor and the magnetic field generated by the second current in the second conductor corresponds to a superimposition of the magnetic field gradient and the magnetic field of a higher order.

An advantage of this embodiment is that the magnetic field gradient and the magnetic field of a higher order can be controlled particularly precisely by the first current and the second current. The first current and the second current can be changed dynamically as well as flexibly and precisely. As a result, a simple, continuous and precise adjustment of the magnetic field of a higher order to magnetic vortex fields is achieved.

In another embodiment of the inventive gradient coil at least a part of the magnetic field of a higher order and at least a part of the magnetic field gradient are generated simultaneously. A predetermined magnetic field is produced by activating the first conductor with a first current and by activating the second conductor with a second current. The predetermined magnetic field can be a combination of the magnetic field gradient and the magnetic field of a higher order. For instance, the direction of the magnetic field gradient and/or the order and/or direction of the magnetic field of a higher order is predetermined by the arrangement of the at least two independent conductors.

This embodiment of the gradient coil allows for a continuous use of the gradient coil for various purposes. Magnetic fields of a higher order can generally be used to improve a homogeneity of magnetic fields of a lower order, in particular zeroth order. The magnetic field of a higher order can improve the homogeneity of a magnetic field gradient generated by at least one further gradient coil, for instance, while the further gradient coil simultaneously generates a magnetic field gradient provided. The magnetic field of a higher order can also be designed to shim a magnetic field gradient generated with the same gradient coil. A gradient coil of this type can consequently be used in a particularly flexible manner.

In another embodiment of the inventive gradient coil, the magnetic field of a higher order is designed to increase the homogeneity of a magnetic field. The magnetic field of a higher order is accordingly a shim field. The amplitude of a shim field typically amounts to at most 10%, preferably at most 1% of the amplitude of the magnetic field to be shimmed. The magnetic field can be the basic magnetic field generated by the main magnet of a magnetic resonance scanner, for instance. The magnetic field can be the magnetic field gradient, for instance. Activation parameters of the gradient coil that are required for the magnetic field of a higher order are determined by the gradient controller. According to this embodiment of the gradient coil, the gradient coil additionally fulfills the function of a shim coil. As a result, it is possible to dispense with a conventional shim coil. This reduces costs. In addition, the space requirement for the gradient system is reduced.

In another embodiment of the inventive gradient coil, the at least two independent conductors are jointly designed to shield the magnetic field gradient and to shield the magnetic field of a higher order outside of the examination region.

The inventive gradient coil can have a primary coil and a secondary coil which corresponds thereto. The primary coil is typically designed to generate a magnetic field gradient in a spatial direction. The secondary coil that corresponds thereto typically shields the magnetic field gradient generated by the primary coil such that this is compensated outside of the gradient coil, and/or so that a magnetic field gradient is not produced outside of the gradient coil. The secondary coil reduces the magnetic field gradient generated by the primary coil within the gradient coil, in particular within the cylindrical patient receiving region and/or examination region. Overall, the gradient coil generates a magnetic field gradient in the examination region. Accordingly the secondary coil typically serves to shield the magnetic field gradient, outside of the examination region, which is generated by the primary coil.

This embodiment of the inventive gradient coil is designed such that the at least two independent conductors jointly produce the magnetic field gradient and the magnetic field of a higher order, and jointly shield the magnetic field gradient and the magnetic field of a higher order outside of the examination region. The first conductor is preferably designed to shield a part of the magnetic field gradient and a part of the magnetic field of a higher order that are attributed to the first current in the first conductor, outside of the examination region. The second conductor is preferably designed to shield a part of the magnetic field gradient and a part of the magnetic field of a higher order that are attributed to the second current in the second conductor outside of the examination region. For this purpose each of the first conductor and the second conductor each has a two-layered structure. The first conductor has a specific spatial arrangement on a lateral area of a cylindrical surface with a first radius, which specific spatial arrangement is approximately repeated on a lateral area of the cylinder with a second radius. The two-layered structure is preferably determined by the first radius and the second radius. The same applies to the second conductor, wherein the first radius and the second radius preferably coincide for the first conductor and the second conductor.

This two-layered structure is usually used in conventional gradient coils, but in conventional shim coils a shielding is dispensed with, due to inadequate space being available. Consequently, magnetic fields of a higher order which are generated by conventional shim coils, cannot be shielded, causing magnetic vortex fields to occur, particularly with the dynamic use of the conventional shim coils. Conventional shim coils are therefore typically not used dynamically.

This embodiment of the gradient coil produces a shielded magnetic field gradient and a shielded magnetic field of a higher order. As a result, the appearance of eddy currents and therefore the appearance of magnetic vortex fields can be counteracted. Compared with a conventional shim coil, the homogeneity of a magnetic field gradient can be improved. In addition, dynamic shimming is permitted as a result. The compensation of magnetic vortex fields of a second order requires dynamic shimming, which is achieved by this embodiment of the gradient coil.

Conductors in conventional gradient coils are typically designed such that a shielding of this type that takes place so that, on account of the generation of a magnetic field gradient, a reaction of electric eddy currents on the examination region is minimal. The spatial arrangement of the at least two independent conductors is to be optimized such that magnetic eddy fields are minimal, because the generation of a magnetic field gradient and/or a magnetic field of a higher order and the magnetic vortex fields still produced can be further suppressed on the basis of a generatable magnetic field of a higher order.

Furthermore, the invention encompasses a gradient coil unit that has an inventive gradient coil and at least two amplifiers, wherein a first of the at least two amplifiers is connected to only a first of the at least two independent conductors and a second of the at least two amplifiers is connected to only a second of the at least two independent conductors.

An amplifier is typically an energy source and/or a voltage source and/or a current source. An amplifier can also be connected to an energy source and/or a voltage source and/or a current source and modulate a current and/or a voltage in one of the at least independent two conductors in accordance with a specification, for instance in accordance with an MR control sequence. The first amplifier and the second amplifier are preferably connected to a gradient controller, which is designed to activate the at least two independent conductors such that a desired magnetic field gradient and/or a desired magnetic field of a higher order can be generated. For this purpose, the gradient controller can be connected to the first amplifier and the second amplifier such that control information can be transmitted, in accordance with which the at least two independent conductors are activated. The at least two amplifiers are activated independently of one another. This allows the aforementioned advantages of the gradient coil to be used. In particular this allows for a precise activation of the gradient coil.

Conventionally a shim coil is activated by a shim amplifier and a gradient coil is activated with a gradient amplifier. A conventional gradient coil and a gradient amplifier form a conventional gradient coil unit. The at least two independent conductors of the inventive gradient coil are typically designed for a rapid switching on and off of high electric currents. For this purpose, gradient coils are typically actively cooled. Conventional shim coils are typically not shielded and are typically activated continuously with a current. Moreover, conventional shim coils are typically not cooled and/or have a smaller conductor diameter than the diameter of a conductor of a gradient coil and/or than the diameter of the at least two conductors which are independent of one another. A maximum current of a shim amplifier typically amounts at most to 10% of a maximum current of a gradient amplifier. Consequently the strength of a magnetic field of a higher order generated with a conventional shim coil is lower than the strength of a magnetic field gradient generated with a conventional gradient coil.

The first amplifier and the second amplifier preferably have the same maximum output. The first amplifier and the second amplifier have a maximum output, which preferably differs by at most 20%, particularly preferably by at most 10%. The maximum output of the first amplifier and/or the second amplifier can be less than the maximum output of a conventional gradient amplifier. If the gradient coil unit has two amplifiers and the maximum output of the first amplifier and the second amplifier corresponds to the maximum output of a conventional gradient amplifier, by comparison with a conventional gradient coil unit, a higher amplitude and/or higher increase rate, in other words a higher slew rate, can be achieved in magnetic field gradients. The maximum output of the first amplifier and/or of the second amplifier of the gradient coil unit can also be lower than the maximum output of a conventional gradient amplifier and nevertheless a magnetic field gradient according to a conventional gradient coil unit can be achieved. A stronger magnetic field of a higher order can be generated, compared with a conventional shim coil, using the inventive gradient coil unit. As a result, magnetic vortex fields can be compensated significantly better and more efficiently. As a result, magnetic vortex fields which relate back to a manufacture-specific asymmetry for instance can be particularly well compensated, thereby improving the quality of the image data. Moreover, a gradient coil unit of this type is cost-effective. Since this can be achieved without additionally shielding obsolete shim coils, the gradient coil unit can be particularly space-saving.

In an embodiment of the inventive gradient coil unit, the first amplifier is designed to generate the first current in the first conductor and the second amplifier is designed to generate the second current in the second conductor. The gradient coil unit can accordingly be controlled particularly accurately.

Furthermore, the invention encompasses a gradient system having three inventive gradient coil units, which are respectively designed in order to generate three magnetic field gradients in three directions which differ from one another and which cover a space. A gradient system of this type achieves the spatial encoding that is required for the magnetic resonance imaging, in three spatial directions, wherein magnetic fields of a higher order can be compensated and/or suppressed particularly effectively in all three spatial directions.

Furthermore, the invention encompasses a method for generating a magnetic field gradient and a magnetic field of a higher order using the inventive gradient coil unit according to the following method steps. A target value is determined in a computer, for the superimposition of a magnetic field gradient that is to be activated, and a basic magnetic field of a magnetic resonance scanner operated by the computer. An estimated actual value of the superimposition of the magnetic field gradient to be activated and the basic magnetic field is also determined by the computer. A deviation of the estimated actual value from the target value is determined by the computer. A requisite magnetic field of a higher order for compensating for the deviation is then determined by the computer. The first current and the second current are determined by the computer such that, when the first current is generated in the first conductor by the first amplifier and when, at the same time, the second current is generated in the second conductor by the second amplifier, the magnetic field gradient and the magnetic field of a higher order are produced. The magnetic field gradient and the magnetic field of a higher order are then produced by activating the first amplifier with the first current and by activating the second amplifier with the second current.

The inventive method is implemented by a gradient system and/or a gradient coil unit that includes a gradient controller with such a computer or processor (processor circuit). The gradient system is preferably connected with and/or integrated in a magnetic resonance apparatus. The magnetic resonance apparatus includes the scanner that generates the basic magnetic field.

The target value of the magnetic field gradient to be activated is preferably a position-dependent value with a spatial resolution, which is to be achieved in a position-dependent manner when the magnetic field gradient to be activated is produced by the superimposition with the basic magnetic field. The magnetic field gradient to be activated is typically predetermined by an MR control sequence that is to be executed for a particular examination. The target value can be stored on a memory and provided to the gradient controller, for instance. The target value can be determined on the basis of predetermined parameters, which relate to the MR control sequence to be executed, and/or the strength of the basic magnetic field. The superimposition of the magnetic field gradient to be activated and the basic magnetic field is typically carried out by forming a sum.

The estimated actual value can be determined experimentally and/or analytically. When the estimated actual value is determined, representing the dependency between the activated magnetic field gradient and the eddy current and/or magnetic vortex field that occur as a result can be determined, and manufacturing inaccuracies and/or changes to a magnetic field on the basis of an examination object can be taken into account. The actual value is typically determined in a spatially resolved manner, similarly to the target value. The determination of the deviation is preferably carried out by forming a difference between the actual value and the target value. The deviation is preferably spatially resolved.

The determination of the requisite magnetic field of a higher order in order to compensate for the deviation can include an approximation of the deviation by magnetic fields that can be generated by the gradient coil unit and/or the gradient system. This approximation preferably takes into account all magnetic fields that can be generated by the gradient coil unit and/or the gradient system that includes the gradient coil unit, regardless of their order. Such a linear combination of the generatable magnetic fields is determined so that this linear combination largely compensates for the deviation. The linear combination of the generatable magnetic fields typically includes at least one magnetic field of a higher order, which can be generated with the gradient coil unit. The linear combination of the generatable magnetic fields is able to be generated by the gradient system and/or the gradient coil unit.

The determination of the first current and the second current is based on the magnetic field of a higher order and on the magnetic field gradient to be generated. Here, the dependency of a magnetic field generated by the first conductor on account of a first current, particularly on the strength of the first current, is typically taken into account. In addition, the dependency of a magnetic field generated by the second conductor on account of a second current on the strength of the second current is typically taken into account. In a further method step, the generation of the magnetic field gradient and of the magnetic field of a higher order is preferably carried out by activating the first amplifier with the first current and by activating the second amplifier with the second current. As a result, a particularly homogenous magnetic field gradient can be generated. This method allows for a particularly precise determination of the requisite magnetic fields for compensating for deviations in the homogeneity of a magnetic field. The magnetic field of a higher order can be used for encoding within the scope of a gradient array technique. In a further method step a target value, which can be taken into account when the first current and the second current are determined, can be acquired for the magnetic field of a higher order.

The advantages of the inventive gradient system, the inventive gradient coil unit and the inventive method essentially correspond to the advantages of the inventive gradient coil, which are explained above in detail. Features, advantages or alternative embodiments described above are applicable to all of the aspects of the invention.

DESCRIPTION OF THE PREFERRED EMBODIMENTS

Figure 1:
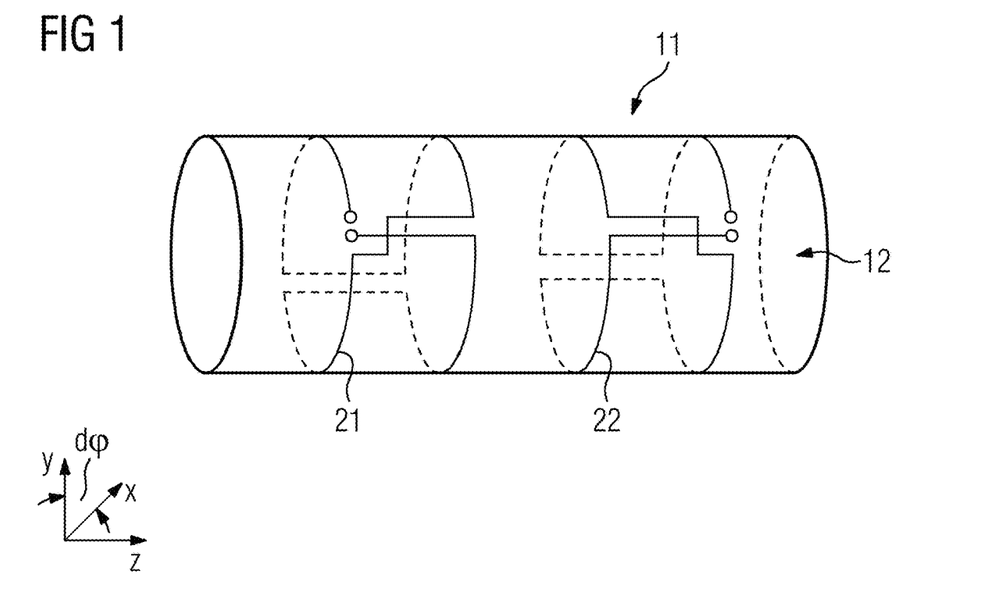
FIG. 1 schematically illustrates a first embodiment of the inventive gradient coil.

FIG. 1 is a schematic representation of a first embodiment of the inventive gradient coil 11. The gradient coil 11 is shaped as a circular hollow cylinder in the case shown, which at least partially surrounds a cylindrical patient receiving region 12 of a magnetic resonance scanner. The examination region is typically a subregion of the patient receiving region 15. The gradient coil 11 comprises two conductors 21, 22 which are independent of one another. The two c independent conductors 21, 22 are shaped so as to be disposed at least partially within the hollow cylindrical shape of the gradient coil 11. The two independent conductors 21, 22 are embedded in the hollow cylindrical shape of the gradient coil 11 by casting. For this purpose, an envelope of the two independent conductors 21, 22, is itself typically a circular hollow cylinder.

The two independent conductors 21, 22, are designed to jointly generate a magnetic field gradient in the examination region 12 and/or in the patient receiving region. Moreover the two independent conductors 21, 22 are designed to jointly generate a magnetic field of a higher order in the examination region 12 and/or in the patient receiving region. The magnetic field of a higher order and the magnetic field gradient are generated simultaneously, for instance by a first current in a first conductor 21 of the two independent conductors 21, 22 and a second current in a second conductor 22 of the two independent conductors 21, 22. The first current and the second current are preferably selected such that the magnetic field of a higher order generated thereby is designed to increase the homogeneity of a magnetic field. In particular, the first current and the second current are changeable in terms of time, as a result of which the magnetic field of a higher order and the magnetic field gradient are changeable in terms of time independently of one another. The gradient coil can accordingly be used to dynamically shim the magnetic field gradient generated thereby.

In order to determine the homogeneity of a magnetic field, like, for instance, a basic magnetic field of the scanner and/or a magnetic field gradient in the scanner, a spherical volume is typically considered within the patient receiving region 12 in the magnetic resonance scanner. Deviations in the homogeneity are typically conveyed in spherical coordinates, wherein the Legendre polynomials are typically used as the basis. The specification of a strength of a magnetic field and/or a deviation in the homogeneity of the magnetic field is typically carried out in spherical function coordinates. Linear deviations along base axes of the magnetic resonance device and/or the gradient coil 11 can be specified by spherical function coordinates of the first order. A base axis corresponds to a spatial direction of the coordinate system of the magnetic resonance device and/or the gradient coil, in particular the x-direction, y-direction and/or z-direction. The x-direction is described for instance by A(1,1), the y-direction by B(1,1) and the z-direction by A(1,0). Accordingly A(1,1), B(1,1) and A(1,0) specify coordinates of the first order. The magnetic field gradient is accordingly a magnetic field of the first order. Spherical function coordinates of a higher order have an order of at least 2. Examples are A(2,0), A(2,1) and A(2,2).

Figure 2:
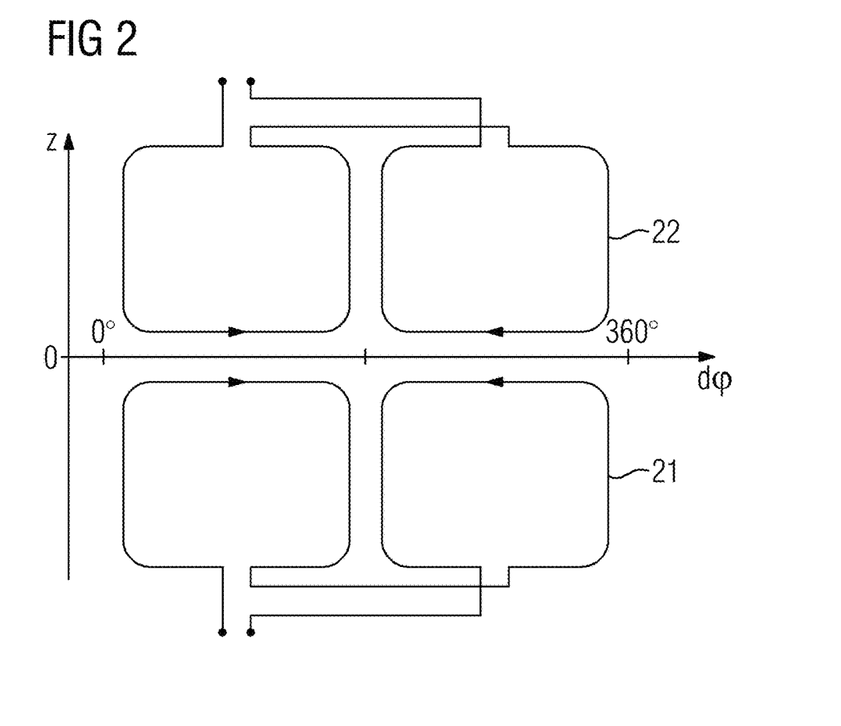
FIG. 2 schematically illustrates the two conductors of the first embodiment, which are independent of one another.

FIG. 2 is a schematic representation of the two independent conductors 21, 22 of the first embodiment. The two independent conductors 21, 22 are designed such that a magnetic field of the order A(1,1) or A(2,1) can be generated as a function of the direction of the first current and the direction of the second current, provided the amplitude of the first current corresponds to the amplitude of the second current. If the directions of the first current and the second current are selected such that these are rectified with the z=0 next section of the respective conductor, the first conductor and the second conductor therefore jointly generate a magnetic field of the order A(1,1), provided the amplitude of the first current corresponds to the amplitude of the second current. The direction of the first current and of the second current for generating a magnetic field of the order A(1,1) is indicated in FIG. 2 by arrows. If the directions of the first current and the second current are selected such that these are rectified with the z=0 next section of the respective conductor, the first conductor and the second conductor therefore jointly generate a magnetic field of the order A(2,1), provided the amplitude of the first current corresponds to the amplitude of the second current. A magnetic field of the order A(2,1) would be generated by the conductor arrangement in FIG. 2, if the direction of the first current or the second current were to oppose the arrows.

The gradient coil 11 is designed to generate a magnetic field gradient and magnetic field of a higher order preferably at least partially simultaneously. This can be achieved by amplitudes of the first current and of the second current which differ from one another. For instance, a third current and a fourth current can firstly be determined by the magnetic field gradient being generated while simultaneously generating the third current in the first conductor and the fourth current in the second conductor. The third current and the fourth current typically have an identical amplitude, but different polarity. If a manufacture-specific asymmetry of the gradient coil 11 is known, for instance, this asymmetry can already be taken into account when the third current and the fourth current are selected, by an amplitude of the third current and/or of the fourth current being selected such that this asymmetry is compensated. In addition, a fifth current and a sixth current can be determined by the magnetic field of a higher order being generated while simultaneously generating the fifth current in the first conductor and the sixth current in the second conductor. The fifth current and the sixth current typically have an identical amplitude. The first current can correspond to a sum of the third current and the fifth current. The second current can correspond to a sum of the fourth current and the sixth current. If the gradient coil 11 is activated according to the first and second current, the magnetic field gradient and the magnetic field of a higher order are generated simultaneously. In particular, the two independent conductors 21, 22 are designed to jointly generate a superimposed magnetic field comprising magnetic fields of the order A(1,1) and A(2,1).

Figure 3:
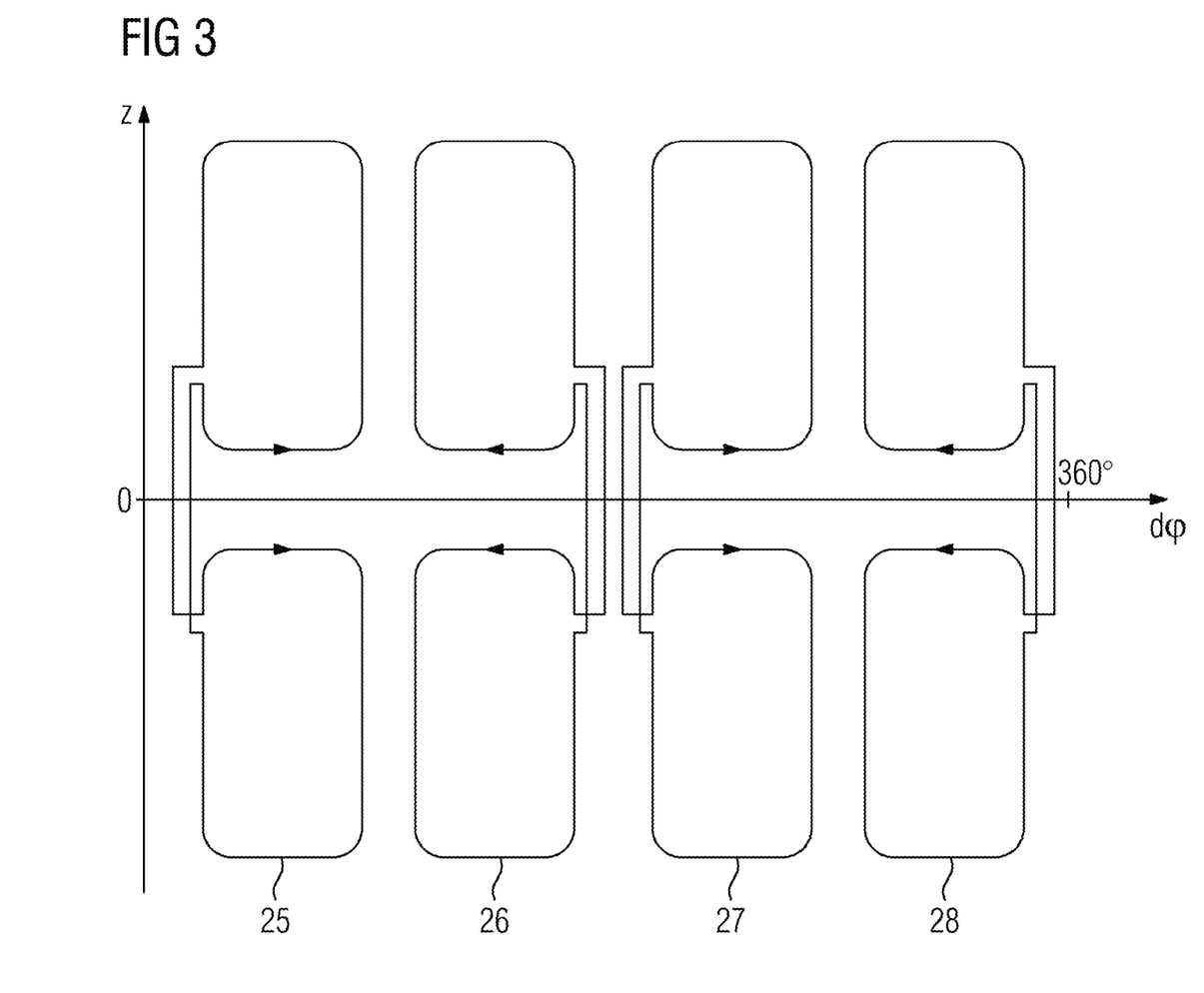
FIG. 3 schematically illustrates conductors, which are independent of one another, of a second embodiment of the inventive gradient coil.

FIG. 3 is a schematic representation of conductors 25, 26, 27, 28, which are independent of one another, of a second embodiment. The four conductors 25, 26, 27, 28 which are independent of one another in this embodiment are typically included in the gradient coil 11. If the conductors 25, 26, 27, 28 which are independent of one another are activated in each case with a current of the same amplitude according to the direction indicated by the arrows, a magnetic field of the order A(2,2) is generated. If, by contrast, the direction of the currents is reversed in the independent conductors 26, 27 which are independent of one another, wherein the direction of the currents in the independent conductors 25, 28 is retained, a magnetic field of the order A(1,1) is thus generated. If different amplitudes are determined for the currents in the conductors 25, 26, 27, 28 which are independent of one another according to the method described in FIG. 2 and/or according to the inventive method, the conductors 25, 26, 27, 28 which are independent of one another are designed to jointly generate a superimposed magnetic field comprising magnetic fields of the order A(1,1) and A(2,2). Preferably each of the independent conductors 25, 26, 27, 28 is connected to an amplifier assigned to the conductor 25, 26, 27, 28.

Figure 4:
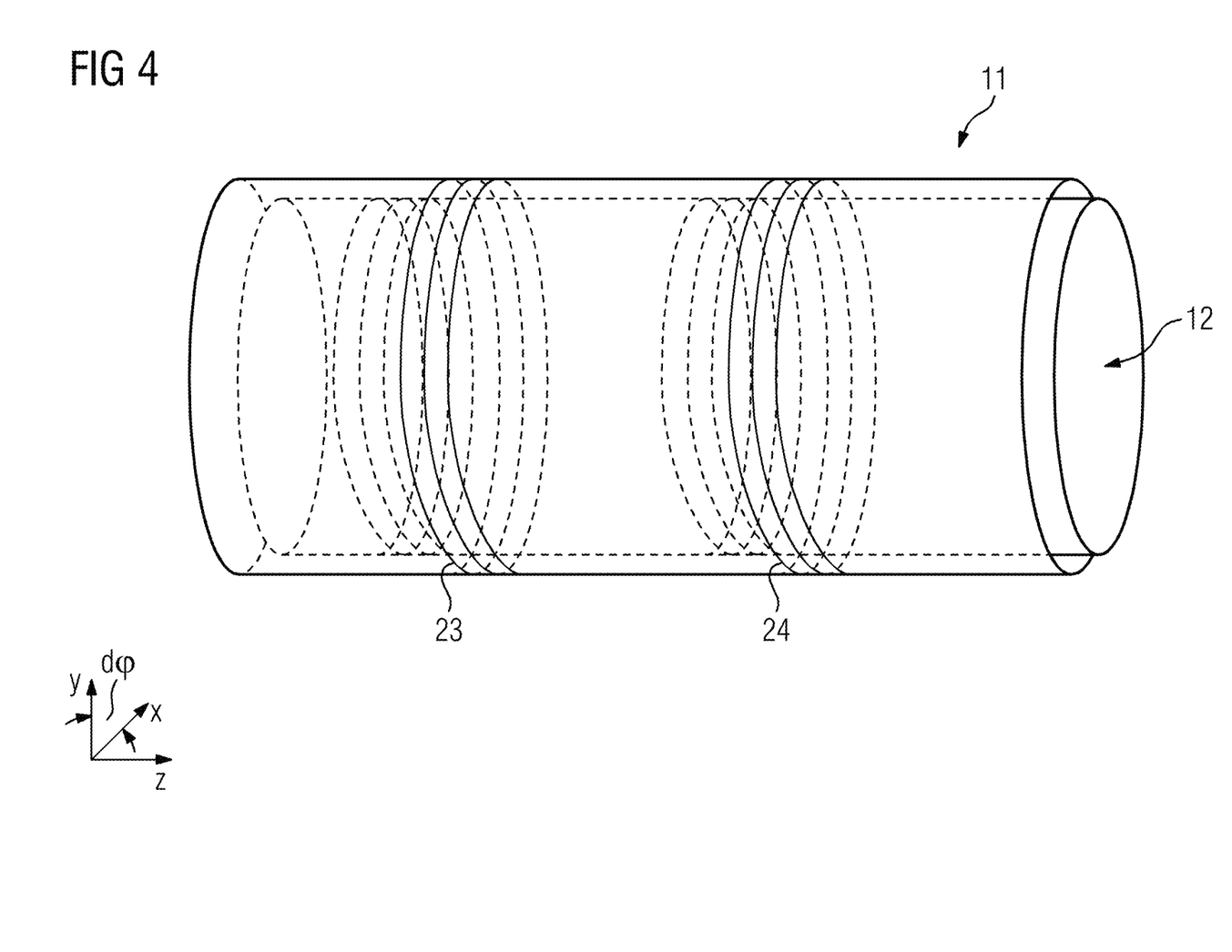
FIG. 4 schematically illustrates a third embodiment of the inventive gradient coil.

FIG. 4 shows a schematic representation of a third embodiment of an inventive gradient coil 11. The gradient coil 11 comprises two independent conductors 23, 24, and which are designed to jointly generate a magnetic field gradient in the examination region 12. Furthermore, the two independent conductors 23, 24 are designed to jointly generate a magnetic field of a higher order in the examination region 12. In addition, the two independent conductors 23, 24 are designed to jointly shield the magnetic field gradient and to shield the magnetic field of a higher order outside of the examination region 12. The part of the two independent conductors 23, 24 that is designed to generate the magnetic field gradient and the magnetic field of a higher order in the examination region 12 is typically referred to as primary coil. The part of the two independent conductors 23, 24 that is designed to shield the magnetic field gradient and the magnetic field of a higher order outside of the examination region 12 is typically referred to as secondary coil. The two independent conductors 23, 24 of the third embodiment can be designed to generate a magnetic field of the order A(1,0) and of the order A(2,0).

Figure 5:
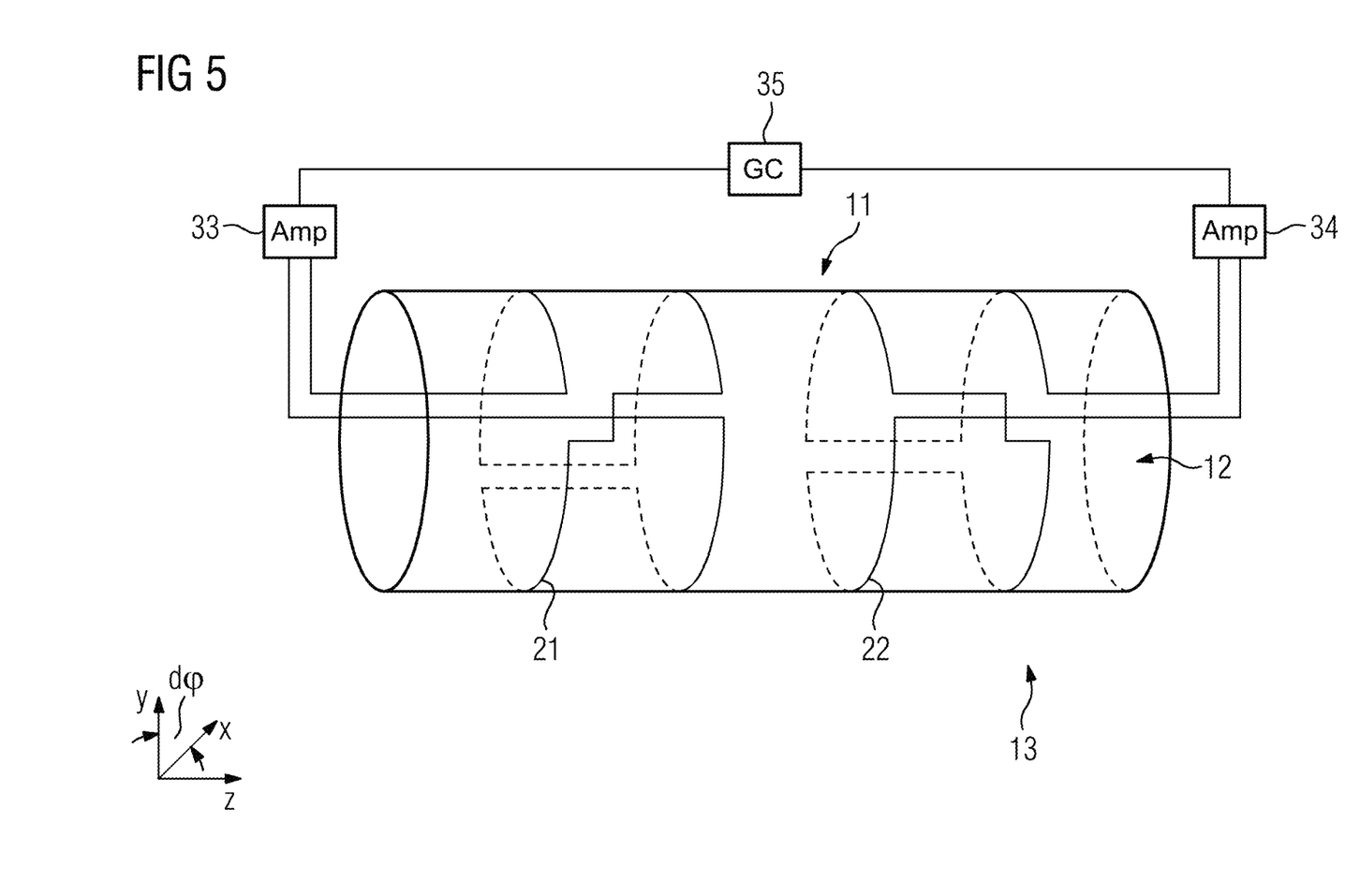
FIG. 5 schematically illustrates the inventive gradient coil unit.

FIG. 5 is a schematic representation of a gradient coil unit 13 according to the invention. The gradient coil unit 13 has a gradient coil 11 with the two independent conductors 21, 22. In this embodiment, the gradient coil 11 includes the first conductor 21 and the second conductor 22. Furthermore, the gradient coil unit 13 has two amplifiers. A first amplifier 33 of the two amplifiers is connected to the first conductor 21 and a second amplifier 34 of the at least two amplifiers is connected to the second conductor 22. The first amplifier 33 is preferably designed to generate a first current in the first conductor 21. The second amplifier 34 is preferably designed to generate a second current in the second conductor 22. The magnetic field gradient and the magnetic field of a higher order can be generated jointly by the first current and the second current.

The first amplifier 33 and the second amplifier 34 are preferably connected to the gradient controller 35. The gradient controller 35 has a computer or processor and is designed to determine the first current and/or the second current. For this purpose, the gradient controller 35 takes into account the spatial arrangement of the two independent conductors 21, 22. Furthermore, the gradient controller 35 is designed to transmit information representing the determined first current to the first amplifier 33. For this purpose the gradient controller 35 is connected to the first amplifier 33. In addition, the gradient controller 35 is designed to transmit information representing the determined second current to the second amplifier 34. For this purpose the gradient controller 35 is connected to the second amplifier 34. The gradient controller 35 can be connected to the gradient controller 13. The gradient controller 35 can be included in the gradient controller 13.

Figure 6:
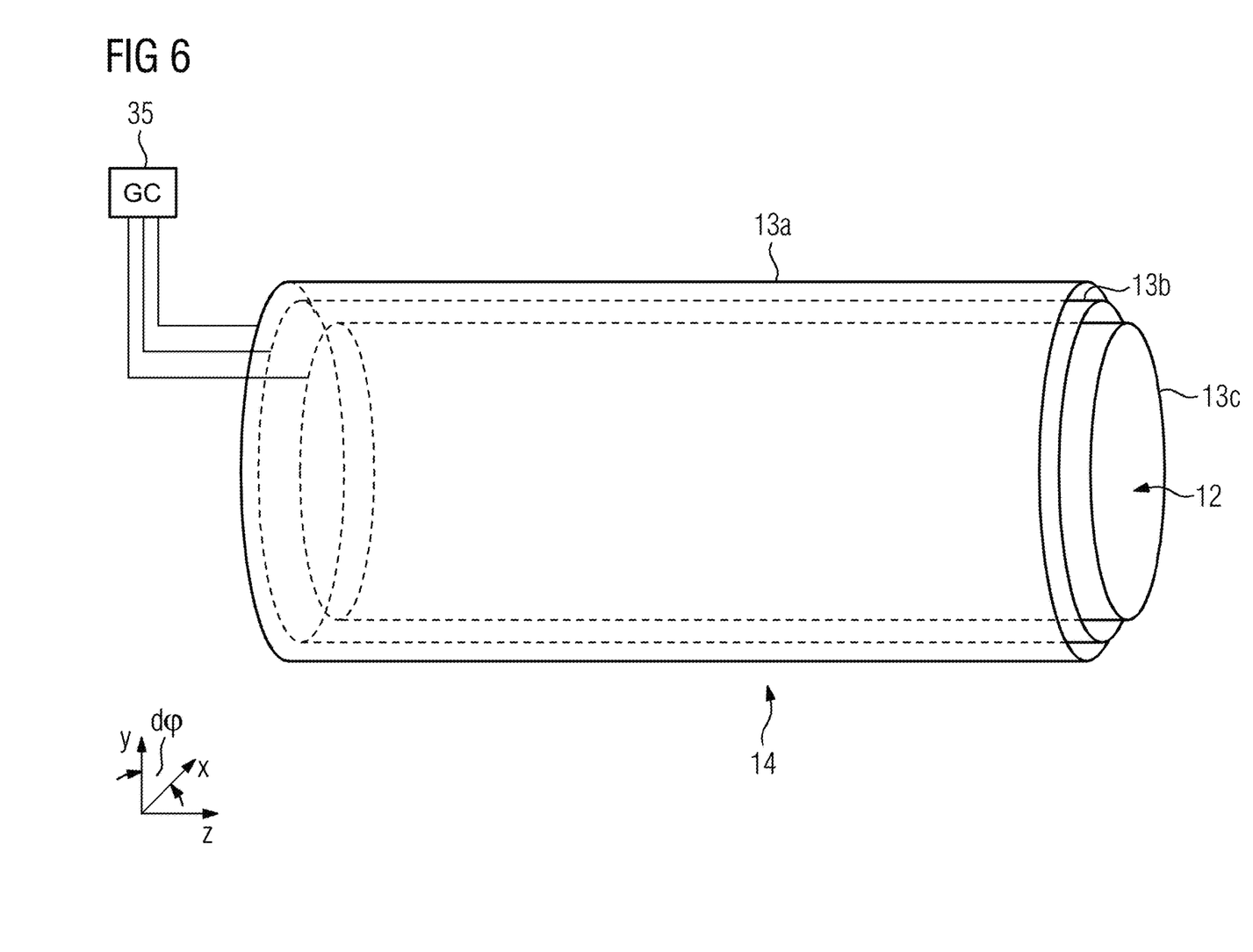
FIG. 6 schematically illustrates the inventive gradient system.

FIG. 6 is a schematic representation of an inventive gradient system 14. The gradient system 14 has three gradient coil units 13a, 13b, 13c, which are designed to generate three magnetic field gradients in three directions that differ from one another. Each gradient coil unit of the three gradient coil units 13a, 13b, 13c is designed to generate a magnetic field gradient in precisely one of the three directions that differ from one another. The two conductors that are independent of one another and are included in each gradient coil unit of the three gradient coil units 13a, 13b, 13c for generating the magnetic field gradient in one direction, preferably precisely one direction, typically have a form that is characteristic of the gradient coil unit and/or the direction of the magnetic field gradient. The three directions that differ from one another preferably correspond to the specified x-direction, y-direction and z-direction. The three directions that differ from one another are designed so as to jointly cover a space. In addition, the three gradient coil units 13a, 13b, 13c are each designed to generate magnetic fields of a higher order. The three gradient coil units 13a, 13b, 13c are preferably each connected to the gradient controller 35. The gradient controller 35 can be included in the gradient system 14. The gradient controller 35 is preferably designed to determine currents for all conductors that are independent of one another and included in the gradient coil units 13a, 13b, 13c and/or to transfer information comprising these currents to the corresponding amplifiers.

Figure 7:
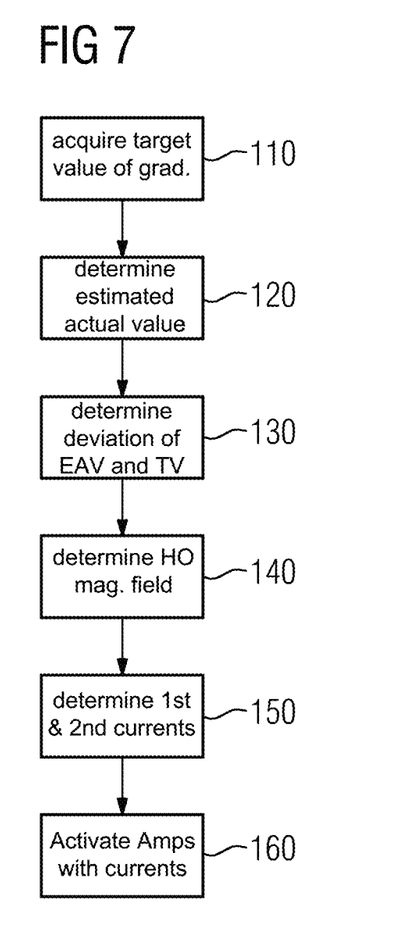
FIG. 7 is a flowchart of the inventive method.

FIG. 7 is a flowchart of the inventive method for generating a magnetic field gradient and a magnetic field of a higher order with the use of the inventive gradient coil unit 13. The magnetic field gradient and the magnetic field of a higher order are typically to be generated such that the resulting superimposition field from the magnetic field gradient and the magnetic field of a higher order is particularly homogenous, in particular has a constant gradient in a spatial direction. Temporal changes to the magnetic field gradient of a higher order are preferably to be compensated dynamically and/or flexibly. For this purpose a target value of a magnetic field gradient to be output is acquired in method step 110. In the following method step 120, an estimated actual value of the magnetic field gradient to be output is determined. The method steps 110 and 120 can be carried out at least partially simultaneously or consecutively. Finally, in method step 130, a deviation in the estimated actual value from the target value is determined and in method step 140 a requisite magnetic field of a higher order is determined to compensate for the deviation. If the requisite magnetic field of a higher order is known, in method step 150 the first current and the second current are determined such that when the first current is generated in the first conductor 21 by the first amplifier and when, at the same time, the second current is generated in the second conductor 22 by the second amplifier, the magnetic field gradient and the magnetic field of a higher order are generated. The real generation, in other words the generation of the magnetic field gradient and the magnetic field of a higher order, is carried out in method step 160 by activating the first amplifier with the first current and by activating the second amplifier with the second current.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A gradient coil unit for use in a magnetic resonance (MR) scanner, said gradient coil unit comprising:
    a gradient coil comprising at least two conductors that are independent of each other;
    a first gradient amplifier connected to a first of said at least two conductors, said first gradient amplifier generating a first current in said first of said at least two conductors;
    a second gradient amplifier connected to a second of said at least two conductors, said second gradient amplifier generating a second current in said second of said at least two conductors; and
    said first and second gradient amplifiers being configured to generate said first and second currents, and said first and second of said at least two conductors being physically configured with respect to each other, so that said first and second of said at least two conductors are simultaneously activated to jointly produce, in an examination region of said MR scanner:
        a magnetic field gradient, and
        a magnetic field of an order of at least two, which is a higher order than said magnetic field gradient.

2. A gradient coil unit as claimed in claim 1 wherein said first gradient amplifier and said second gradient amplifier are configured to generate said first and second currents, respectively, in order to cause at least a portion of said magnetic field of an order of at least two and at least a portion of said magnetic field gradient to occur simultaneously.

3. A gradient coil unit as claimed in claim 1 wherein said first and second gradient amplifiers are configured to generate said first and second currents, respectively, and wherein said at least two conductors have a spatial relationship with respect to each other, in order to cause said magnetic field of an order of at least two to increase a homogeneity of a magnetic field in said examination region.

4. A gradient coil unit as claimed in claim 1 wherein said first and second amplifiers are configured to generate said first and second currents, respectively, so as to dynamically produce at least one of: said magnetic field of an order of at least two, and said magnetic field gradient.

5. A gradient coil unit as claimed in claim 1 wherein said at least two conductors have a spatial relationship with respect to each other so that said magnetic field gradient and said magnetic field of an order of at least two are shielded outside of said examination region.

6. A gradient system comprising:
    three gradient coil units that each generate a magnetic field gradient in a respective direction, said respective directions being different from each other and covering a three-dimensional space in an examination region of a magnetic resonance scanner; and
    each of said three gradient coil units comprising a gradient coil comprising at least two conductors that are independent of each other, a first gradient amplifier connected to a first of said at least two conductors, said first gradient amplifier generating a first current in said first of said at least two conductors, and a second gradient amplifier connected to a second of said at least two conductors, said second gradient amplifier generating a second current in said second of said at least two conductors, wherein said first and second gradient amplifiers are configured to generate said first and second currents, said first and second of said at least two conductors being physically configured with respect to each other, so that said first and second of said at least two conductors are simultaneously activated to jointly produce in said examination region:
    said magnetic field gradient, and
    a magnetic field of an order of at least two, which is a higher order than said magnetic field gradient.

7. A gradient coil comprising:
    at least two conductors that are independent of each other, said at least two conductors being configured to be simultaneously activated to jointly generate:
        a magnetic field gradient in an examination region of a magnetic resonance scanner; and
        a magnetic field of an order of at least two, which is a higher order than said magnetic field gradient, in said examination region.

8. A method for generating a magnetic field gradient and a magnetic field of a higher order than said magnetic field gradient comprising:
    providing a gradient coil comprising at least two conductors that are independent of each other;
    with a first gradient amplifier connected to a first of said at least two conductors, generating a first current in said first of said at least two conductors;
    with a second gradient amplifier connected to a second of said at least two conductors, generating a second current in said second of said at least two conductors;
    with said first and second gradient amplifiers generating said first and second currents, and physically configuring said first and second of said at least two conductors with respect to each other, so that said first and second of said at least two conductors jointly produce a magnetic field gradient in an examination region of a magnetic resonance scanner and jointly produce a magnetic field of a higher order than said magnetic field gradient in said examination region;
    in a computer, detecting a target value of a superimposition of said magnetic field gradient to be produced in said examination region, and a basic magnetic field of said magnetic resonance scanner;
    in said computer, determining an estimated actual value of a superimposition of the magnetic field gradient to be produced in said examination region, and the basic magnetic field;
    in said computer, determining a deviation in the estimated actual value from the target value;

in said computer, determining a requisite magnetic field of a higher order that compensates for the deviation;

in said computer, determining the first current and the second current such that when the first current is generated in the first conductor by the first gradient amplifier and when, at the same time, the second current is generated in the second conductor by the second gradient amplifier, the magnetic field gradient and the magnetic field of a higher order are generated; and generating the magnetic field gradient and the magnetic field of a higher order by activating the first gradient amplifier from said computer so as to generate the first current and by activating the second gradient amplifier from said computer so as to generate the second current.

9. A method according to claim 8 wherein the magnetic field of a higher order is a magnetic field of an order of at least two and the requisite magnetic field of a higher order is a magnetic field of an order of at least two.

10. A gradient coil unit as claimed in claim 1 wherein the magnetic field gradient is of a first order.

11. A gradient system as claimed in claim 6 wherein the magnetic field gradient is of a first order.

12. A gradient system of claim 6 further comprising a computer that is configured to:

detect a target value of a superimposition of said magnetic field gradient to be produced in said examination region, and a basic magnetic field of said magnetic resonance scanner;

determine an estimated actual value of a superimposition of the magnetic field gradient to be produced in said examination region, and the basic magnetic field;

determine a deviation in the estimated actual value from the target value;

determine a requisite magnetic field of a higher order that compensates for the deviation;

determine the first current and the second current such that when the first current is generated in the first conductor by the first amplifier and when, at the same time, the second current is generated in the second conductor by the second amplifier, the magnetic field gradient and the magnetic field of a higher order are generated; and activate the first gradient amplifier and the second gradient amplifier to respectively generate the first and second currents to generate the magnetic field gradient and the magnetic field of an order of at least two.

13. A gradient coil unit as claimed in claim 1 wherein, to jointly produce the magnetic field gradient and jointly produce the magnetic field of an order of at least two:

the first conductor of said at least two conductors is configured to generate, in said examination region: a first component of the magnetic field gradient and a first component of the magnetic field of an order of at least two; and the second conductor of said at least two conductors is configured to generate, in said examination region: a second component of the magnetic field gradient and a second component of the magnetic field of an order of at least two.

* * * * *